(12) United States Patent
Natori et al.

(10) Patent No.: US 8,587,043 B2
(45) Date of Patent: Nov. 19, 2013

(54) MAGNETORESISTIVE RANDOM ACCESS MEMORY AND METHOD OF MANUFACTURING THE SAME

(75) Inventors: Katsuaki Natori, Yokohama (JP); Koji Yamakawa, Tokyo (JP); Daisuke Ikeno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 362 days.

(21) Appl. No.: 13/051,945

(22) Filed: Mar. 18, 2011

(65) Prior Publication Data

US 2012/0007196 A1 Jan. 12, 2012

(30) Foreign Application Priority Data

Jul. 9, 2010 (JP) ................................. 2010-157175

(51) Int. Cl.
*H01L 29/82* (2006.01)
*H01L 21/8246* (2006.01)

(52) U.S. Cl.
USPC ............ 257/295; 257/E21.665; 257/E29.323; 438/3

(58) Field of Classification Search
USPC ........ 257/295, 421, E29.323, E21.665; 438/3
See application file for complete search history.

(56) References Cited

U.S. PATENT DOCUMENTS

| | | | |
|---|---|---|---|
| 6,829,121 B2 * | 12/2004 | Ikeda et al. ................ | 428/811.5 |
| 2005/0145925 A1 | 7/2005 | Ozawa | |
| 2006/0114736 A1 | 6/2006 | Ozawa | |
| 2008/0054341 A1 | 3/2008 | Natori et al. | |
| 2009/0098412 A1 | 4/2009 | Ohsawa et al. | |

FOREIGN PATENT DOCUMENTS

| | | |
|---|---|---|
| JP | 2005-197363 | 7/2005 |
| JP | 2009-094244 | 4/2009 |

OTHER PUBLICATIONS

Toshiba, Background Art Information, Aug. 18, 2010 and Jan. 19, 2011.

* cited by examiner

*Primary Examiner* — Julio J Maldonado
*Assistant Examiner* — Daniel Shook
(74) *Attorney, Agent, or Firm* — Knobbe, Martens, Olson & Bear LLP

(57) ABSTRACT

According to one embodiment, a magnetoresistive random access memory includes a magnetoresistive element in a memory cell, the magnetoresistive element including a first metal magnetic layer, a second metal magnetic layer, and an insulation layer interposed between the first and second metal magnetic layers. An area of each of the first and second metal magnetic layers is smaller than an area of the insulation layer.

8 Claims, 7 Drawing Sheets

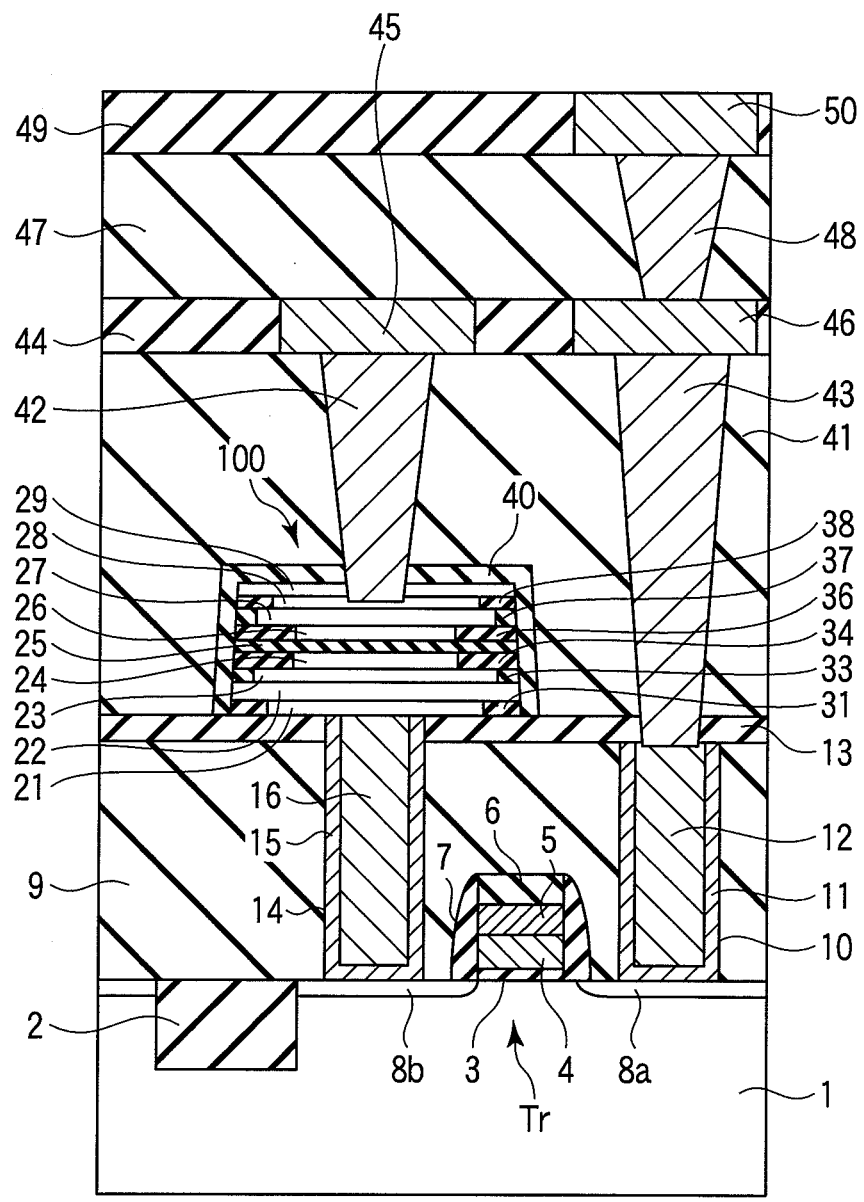
F I G. 7

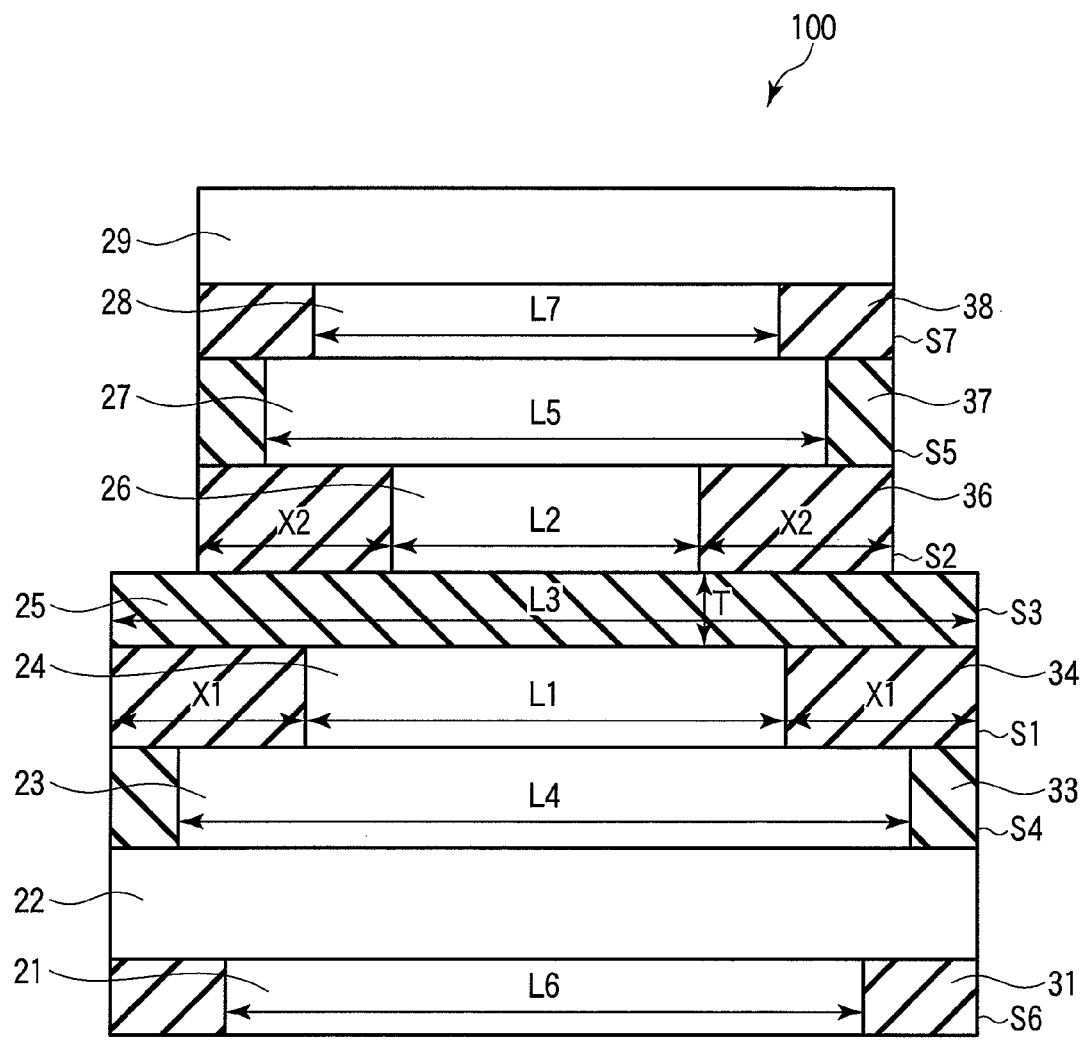
F I G. 8

US 8,587,043 B2

MAGNETORESISTIVE RANDOM ACCESS MEMORY AND METHOD OF MANUFACTURING THE SAME

CROSS-REFERENCE TO RELATED APPLICATIONS

This application is based upon and claims the benefit of priority from Japanese Patent Application No. 2010-157175, filed Jul. 9, 2010; the entire contents of which are incorporated herein by reference.

FIELD

Embodiments described herein relate generally to a magnetoresistive random access memory (MRAM) which makes use of a tunneling magnetoresistive (TMR) effect, and a method of manufacturing the same.

BACKGROUND

In recent years, magnetoresistive random access memories using a tunneling magnetoresistive effect have been proposed. In this type of memory, an MTJ (Magnetic Tunnel Junction) element having a multilayer of a metal magnetic film/insulation film/metal magnetic film is used. The variation in resistance of the MTJ element is determined by the magnetic states of metal magnetic bodies on both interfaces of an insulation film, and data is stored by the magnetization state of the MTJ element.

As methods of varying the magnetization state of the MTJ element, there are a "current field write method" using a magnetic field which is generated by an electric current through wiring lines, and a "spin transfer torque writing method" using a spin-polarized electric current. In the current field write method, since it is necessary to dispose wiring lines for generating a magnetic field in the vicinity of the MTJ element, there is a problem that an increase in integration is difficult. On the other hand, in the spin transfer torque writing method, since a memory cell is basically composed of a pair of cell select transistors and an MTJ element, like a DRAM, there is a feature that an increase in integration is easy.

However, in the spin transfer torque writing method, although the magnetic state is controlled by the direction of a current flowing in the MTJ element, a relatively high current density (~1 MA/cm$^2$) is necessary at the time of write. Hence, a select transistor, which enables the flow of a current corresponding to the area of the MTJ element, is required, leading to a bottleneck to the reduction in size of the select transistor.

If the volume of the magnetic body which constitutes the MTJ element is small, the write current can be decreased and the current flowing in the select transistor can be reduced. However, if the film thickness of the magnetic body is decreased, the magnetic anisotropy energy decreases, and this causes degradation in retention or a decrease in signal amount. In addition, since the area of the MTJ element is determined by the minimum feature dimension of lithography, there is a problem that it is difficult to reduce the volume of the magnetic body.

BRIEF DESCRIPTION OF THE DRAWINGS

FIG. 7 is a cross-sectional view illustrating a fabrication step, following the step of FIG. 6, of the magnetoresistive random access memory according to the embodiment.

FIG. 8 is a cross-sectional view showing another MTJ element of the magnetoresistive random access memory according to the embodiment.

DETAILED DESCRIPTION

Figure 1:
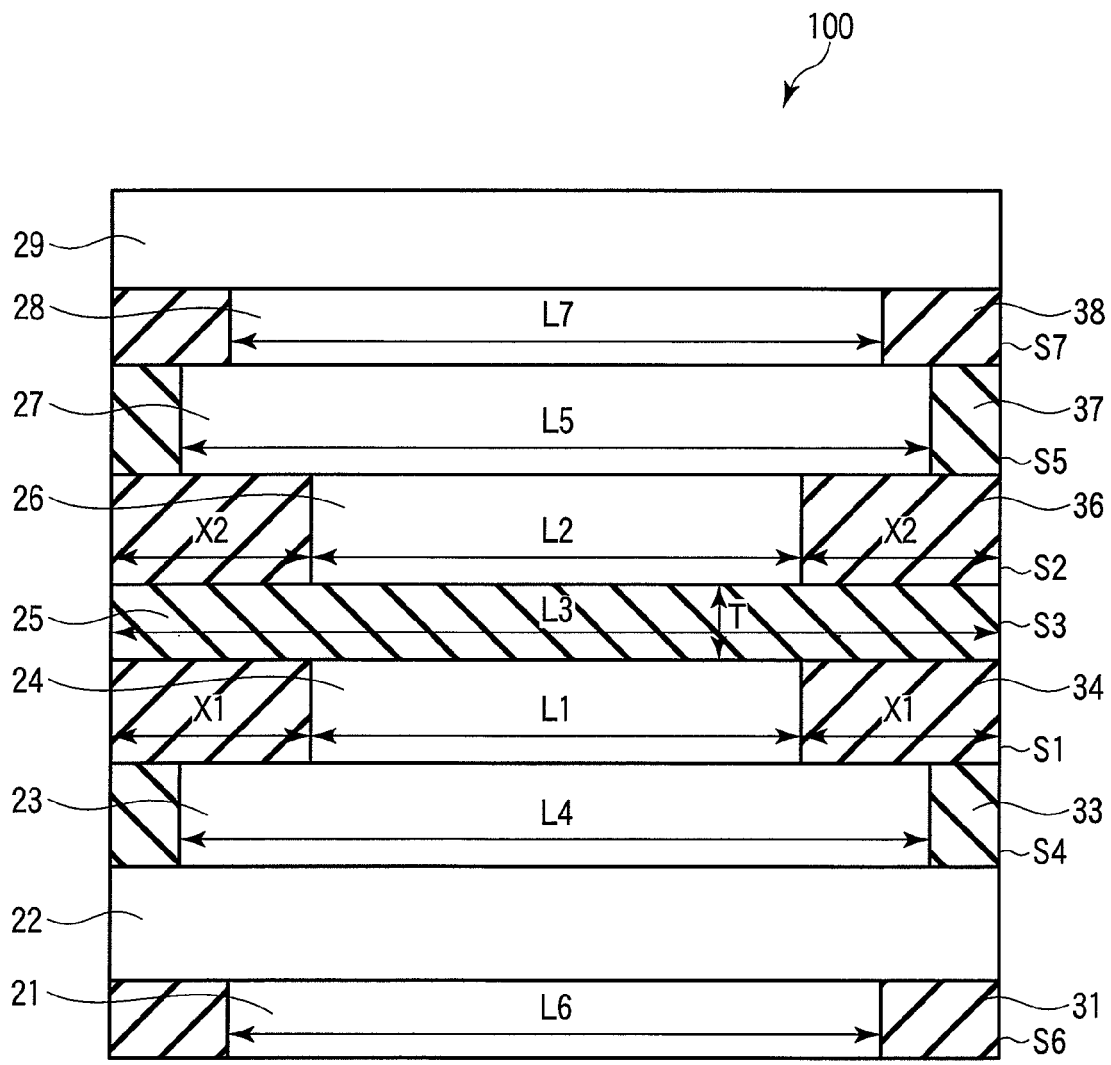
FIG. 1 is a cross-sectional view showing an MTJ element of a magnetoresistive random access memory according to an embodiment.

In general, according to one embodiment, a magnetoresistive random access memory includes a magnetoresistive element in a memory cell, the magnetoresistive element including a first metal magnetic layer, a second metal magnetic layer, and an insulation layer interposed between the first and second metal magnetic layers. An area of each of the first and second metal magnetic layers is smaller than an area of the insulation layer.

Embodiments will now be described with reference to the accompanying drawings. In the description below, common parts are denoted by like reference numerals throughout the drawings.

[1] Structure of MTJ Element

Figure 2:
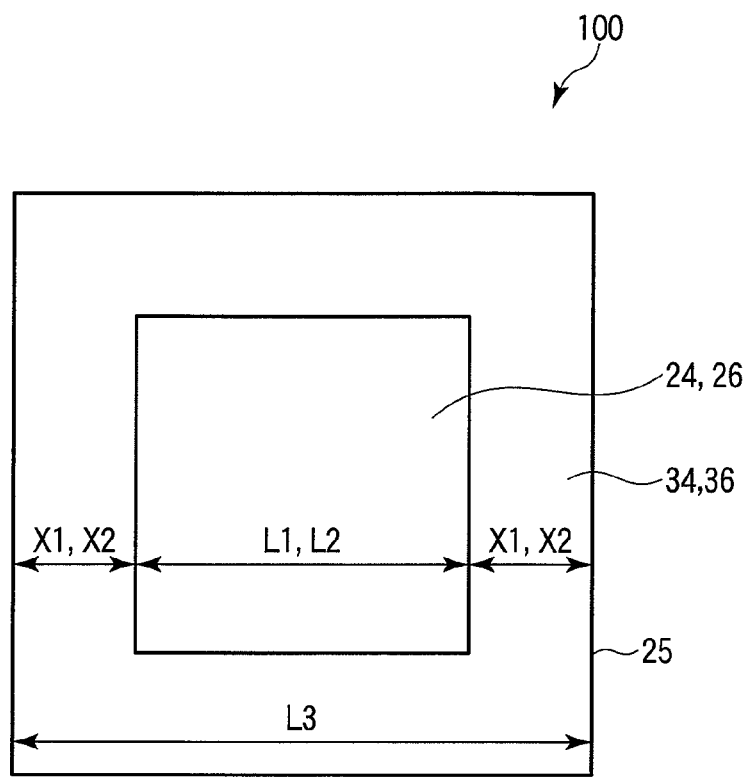
FIG. 2 is a plan view showing a part of the MTJ element of the magnetoresistive random access memory according to the embodiment.

FIG. 1 is a cross-sectional view of an MTJ (magnetoresistive element) which is provided in a memory cell of a magnetoresistive random access memory according to an embodiment. FIG. 2 is a plan view of a part of the MTJ element shown in FIG. 1. The structure of the MTJ element according to the embodiment is described below.

As shown in FIG. 1, an MTJ element 100 comprises a lower electrode 21, an orientation control film 22, a pinned layer 23, a first highly oriented magnetic film 24, a tunneling barrier film 25, a second highly oriented magnetic film 26, a recording layer 27, an upper electrode 28, a CVD (Chemical Vapor Deposition) oxide film 29, and oxide films 31, 33, 34, 36, 37 and 38.

The tunneling barrier film 25 is interposed between the pinned layer 23 and recording layer 27. The first highly oriented magnetic film 24 is disposed between the pinned layer 23 and tunneling barrier film 25. The second highly oriented magnetic film 26 is disposed between the recording layer 27 and tunneling barrier film 25. Both the first highly oriented magnetic film 24 and second highly oriented magnetic film 26 are in contact with the tunneling barrier film 25.

The orientation control film 22 is disposed on that surface of the pinned layer 23, which is opposite to the surface thereof facing the first highly oriented magnetic film 24. The lower electrode 21 is disposed on that surface of the orientation control film 22, which is opposite to the surface thereof facing the pinned layer 23.

The upper electrode 28 is disposed on that surface of the recording layer 27, which is opposite to the surface thereof facing the second highly oriented magnetic film 26. The CVD oxide film 29 is disposed on that surface of the upper electrode 28, which is opposite to the surface thereof facing the recording layer 27.

The oxide film 31 is formed on side surfaces of the lower electrode 21. The oxide film 33 is formed on side surfaces of the pinned layer 23. The oxide film 34 is formed on side surfaces of the first highly oriented magnetic film 24. The oxide film 36 is formed on side surfaces of the second highly oriented magnetic film 26. The oxide film 37 is formed on side surfaces of the recording layer 27, and the oxide film 38 is formed on side surfaces of the upper electrode 28. The concentration of oxygen in these oxide films 31, 33, 34, 36, 37 and 38 is, for example, 10% or more.

The MTJ element 100 has a vertical shape with side surfaces extended in a direction perpendicular to the substrate 1. The taper angle of each side surface of the MTJ element should preferably be 80° or more, and more preferably 85° or more. Thereby, a higher integration of the device can be achieved.

A side surface S6 of the oxide film 31, which is opposite to a side surface thereof facing the lower electrode 21; a side surface of the orientation control film 22; a side surface S4 of the oxide film 33, which is opposite to a side surface thereof facing the pinned layer 23; a side surface S1 of the oxide film 34, which is opposite to a side surface thereof facing the first highly oriented magnetic film 24; a side surface S3 of the tunneling barrier film 25; a side surface S2 of the oxide film 36, which is opposite to a side surface thereof facing the second highly oriented magnetic film 26; a side surface S5 of the oxide film 37, which is opposite to a side surface thereof facing the recording layer 27; a side surface S7 of the oxide film 38, which is opposite to a side surface thereof facing the upper electrode 28; and a side of the CVD oxide film 29, are flush with one another.

Each of a length L1 of the first highly oriented magnetic layer 24, a length L2 of the second highly oriented magnetic layer 26, a length L4 of the pinned layer 23, a length L5 of the recording layer 27, a length L6 of the lower electrode 21 and a length L7 of the upper electrode 28 is less than a length L3 of the tunneling barrier film 25. Each of the lengths L1 to L7, in this context, refers to the length in the horizontal direction with reference to the film surface.

Each of the length L1 of the first highly oriented magnetic layer 24 and the length L2 of the second highly oriented magnetic layer 26 is less than each of the length L4 of the pinned layer 23, the length L5 of the recording layer 27, the length L6 of the lower electrode 21 and the length L7 of the upper electrode 28. The length L1 of the first highly oriented magnetic layer 24 and the length L2 of the second highly oriented magnetic layer 26 may be equal or different. In the case of the latter, for the reason of the improvement of the efficiency of injection of a reversing current, it is preferable that the length L1 of the first highly oriented magnetic layer 24 be greater than the length L2 of the second highly oriented magnetic layer 26. Specifically, the variation of resistance of the MTJ element 100 occurs due to the reversion of the magnetization of the recording layer 27 by the injection of electrons from the pinned layer 23. Thus, in order to improve the efficiency of reversion, it is necessary to increase the current density of the recording layer 27, while suppressing the increase of the whole electric current. Therefore, if the length L2 of the recording layer 27 side is made smaller than the length L1 of the pinned layer 23 side, the current density of the recording layer can advantageously be increased while the current in the recording layer 27 is unchanged, compared to the case where the length L2 and length L1 are equal.

For example, in the case where the L3 of the tunneling barrier film 25 is 50 nm, each of film thicknesses X1 and X2 of the oxide films 34 and 36 in the horizontal direction with reference to the film surface is 10 nm. Specifically, the length L1 of the first highly oriented magnetic layer 24 and the length L2 of the second highly oriented magnetic layer 26 are 30 nm, respectively.

The film thicknesses X1 and X2 of the oxide films 34 and 36 are properly chosen, based on the relationship between the area (resistance) of the MTJ element 10 and the required write current. When each of the film thicknesses X1 and X2 of the oxide films 34 and 36 is 1/10 or more of the radius of the MTJ element 100, the advantageous effect of the present embodiment is greatly exhibited. For example, when the diameter of the MTJ element 100 is 40 nm, 30 nm and 20, each of the film thicknesses X1 and X2 of the oxide films 34 and 36 is 4 nm or more, 3 nm or more, and 2 nm or more, respectively.

As regards the lower limits of the film thicknesses X1 and X2 of the oxide films 34 and 36, when these lower limits are set to be the film thickness T or more of the tunneling barrier film 25 in the vertical direction with reference to the film surface of the tunneling barrier film 25, the effect is enhanced. Although the electrical conductivity at the side wall of the MTJ element 100 increases due to damage, adhering matter, etc., if each of the film thicknesses X1 and X2 of the oxide films 34 and 36 is set to be greater than the film thickness T of the tunneling barrier film 25, the current density at the side wall part of the MTJ element 100 becomes higher when an electric current tunnels the tunneling barrier film 25 than when an electric current flows via the side wall. Thus, the current, which does not contribute to the magnetoresistive effect, can be suppressed, and the write current can be decreased. For example, when the film thickness T of MgO of the tunneling barrier film 25 is 1 nm, the lower limit of each of the film thicknesses X1 and X2 of the oxide films 34 and 36 is 1 nm.

As shown in FIG. 2, in the plan-view shape of the MTJ element 100 in the horizontal direction with reference to the film surface of the MTJ element 100, the area of each of the first highly oriented magnetic film 24 and second highly oriented magnetic film 26 is smaller than the area of the tunneling barrier film 25.

In FIG. 2, the plan-view shape of the MTJ element 100 is depicted as being square. However, the plan-view shape of the MTJ element 100 is not limited to this example, and may be variously changed to, for instance, a circle, an ellipsoid, a rectangle, a parallelogram, a cross (+) shape, or a C shape.

[2] Materials of MTJ Element

The materials of the respective layers constituting the MTJ element 100 are, for example, as follows. However, these materials are not limited to the examples below, and may be changed to other general materials.

As the material of the pinned layer 23, use is made of, for example, $Fe_{50}Pt_{50}$, $Co_{50}Pt_{50}$, or $Co_{30}Fe_{20}Pt_{50}$. In addition, $(Fe_{50}Pt_{50})_{88}$—$(SiO_2)_{12}$, for instance, which has a structure in which the above material is divided by $SiO_2$, MagO, etc., may be used for the pinned layer 23.

As the recording layer 27, [Co/Pt]5, for instance, is used. As the recording layer 27, not only a Co/Pt artificial lattice but also a Co/Pd artificial lattice may be used. Depending on characteristics, the number of multilayer periods may be varied in the range of 1 to 10.

As the materials of the pinned layer 23 and recording layer 27, the following ferromagnetic materials may also be used. For example, use may be made of Fe, Co, Ni, Tb, Dy, Gd, a multilayer film thereof, an alloy thereof, a magnetite with a high spin polarization ratio, an oxide such as $CrO_2$ or $RXMnO_{3-y}$ (R; rare earth, X; Ca, Ba, Sr), or a Heusler alloy such as NiMnSb or PtMnSb. As long as ferromagnetic properties are not lost, these magnetic bodies may include a non-magnetic element, such as Ag, Cu, Au, Al, Mg, Si, Bi, Ta, B, C, O, N, Pd, Pt, Zr, Ir, W, Mo or Nb, or may include a layer containing these elements.

The tunneling barrier film 25 is an insulation layer. For example, MgO (magnesium oxide) or $Al_2O_3$ (alumina) is used for the tunneling barrier film 25. As the orientation control film 22, for example, Pt, Ir, Ru, or a multilayer film thereof is used. The first highly oriented magnetic film 24 and second highly oriented magnetic film 26 are metal magnetic layers, and an alloy including Co and Fe is used. In the present embodiment, $Co_{40}Fe_{40}B_{20}$ is used, but the composition is properly varied depending on the requirement for characteristics of the device. For example, Ta is used as the material of the lower electrode 21 and upper electrode 28.

In order to fix the pinned layer 23 in one direction, an antiferromagnetic layer may be provided adjacent to the pinned layer 23. As this antiferromagnetic layer, used may be made of, for instance, alloys of Mn, and one or more of Fe, Ni, Pt, Pd, Ru, OS and Ir, such as FeMn, NiMn, PtMn, PtPdMn, RuMn, OsMn, IrMn and CrPtMn.

[3] Method of Manufacturing the Magnetoresistive Random Access Memory

FIG. 3 to FIG. 7 are cross-sectional views illustrating fabrication steps of the magnetoresistive random access memory according to the embodiment. The method of manufacturing the magnetoresistive random access memory according to the embodiment will now be described.

Figure 3:
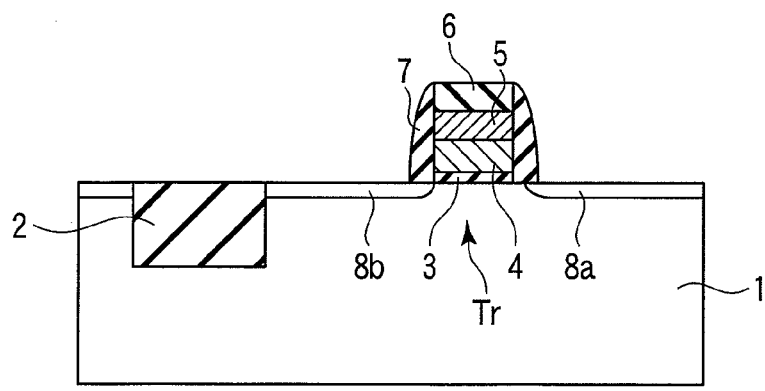
FIG. 3 is a cross-sectional view illustrating a fabrication step of the magnetoresistive random access memory according to the embodiment.

To start with, as shown in FIG. 3, a trench for device isolation is formed in an area other than a transistor active area on the surface of, e.g. a P-type Si substrate 1. An $SiO_2$ film is buried in this trench. Thereby, a device isolation region 2 of an STI (Shallow Trench Isolation) structure is formed.

Subsequently, a transistor Tr for performing a switch operation is formed in the following manner. An oxide film 3 with a thickness of about 60 Å is formed on the Si substrate 1 by thermal oxidation. Then, an $n^+$ type polycrystalline silicon film 4, which is doped with, e.g. arsenic, is formed on the surface of the Si substrate 1, and a WSix film 5 and a nitride film 6 are successively formed on the polycrystalline silicon film 4. Thereafter, the polycrystalline silicon film 4, WSix film 5 and nitride film 6 are processed by an ordinary photolithography method and RIE (Reactive Ion Etching) method, and thus a gate electrode is formed. Further, a nitride film 7 is deposited on the gate electrode. Then, spacer portions, which are formed of the nitride film 7, are provided on side walls of the gate electrode by a sidewall-leaving technique by RIE. Next, although the details of the process are omitted, source/drain regions 8a and 8b are formed in surface portions of the Si substrate 1 by ion implantation and heat treatment. Thereby, a select transistor Tr functioning as a switching device of a memory cell is formed.

Figure 4:
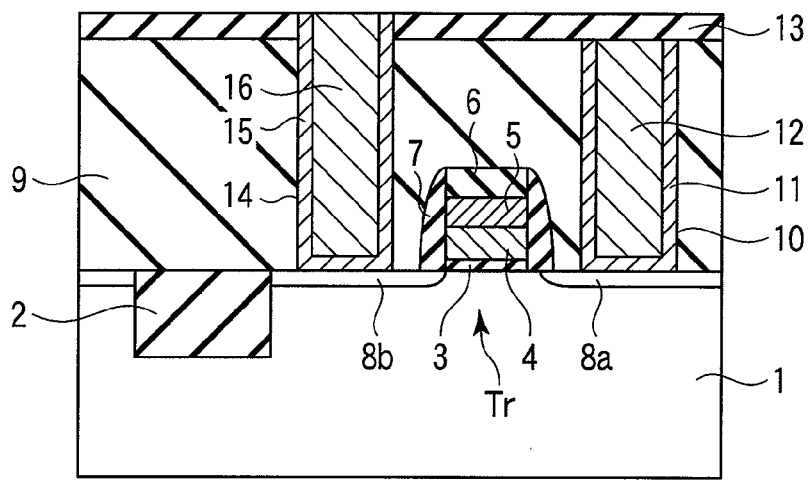
FIG. 4 is a cross-sectional view illustrating a fabrication step, following the step of FIG. 3, of the magnetoresistive random access memory according to the embodiment.

Next, as shown in FIG. 4, after a CVD oxide film 9 is deposited on the transistor Tr, the resultant structure is planarized by CMP (Chemical Mechanical Polish). Then, a contact hole 10, which communicates with the source/drain region 8a, is formed in the CVD oxide film 9. Subsequently, a thin titanium film is deposited in the contact hole 10 by sputtering or CVD, and is subjected to heat treatment in a forming gas. Thus, a TiN film 11 is formed. Then, CVD tungsten is deposited on the TiN film 11, and the tungsten and the TiN film 11, which are present outside the contact hole 10, are removed by CMP. Thereby, the tungsten is buried in the contact hole 10, and a contact 12 is formed. Thereafter, a CVD nitride film 13 is deposited on the CVD oxide film 9 and contact 12. Further, a contact hole 14, which communicates with the other source/drain region 8b, is formed. Like the formation of the contact 12, a TiN film 15 and tungsten are buried in the contact hole 14, and a contact 16 is formed.

Figure 5:
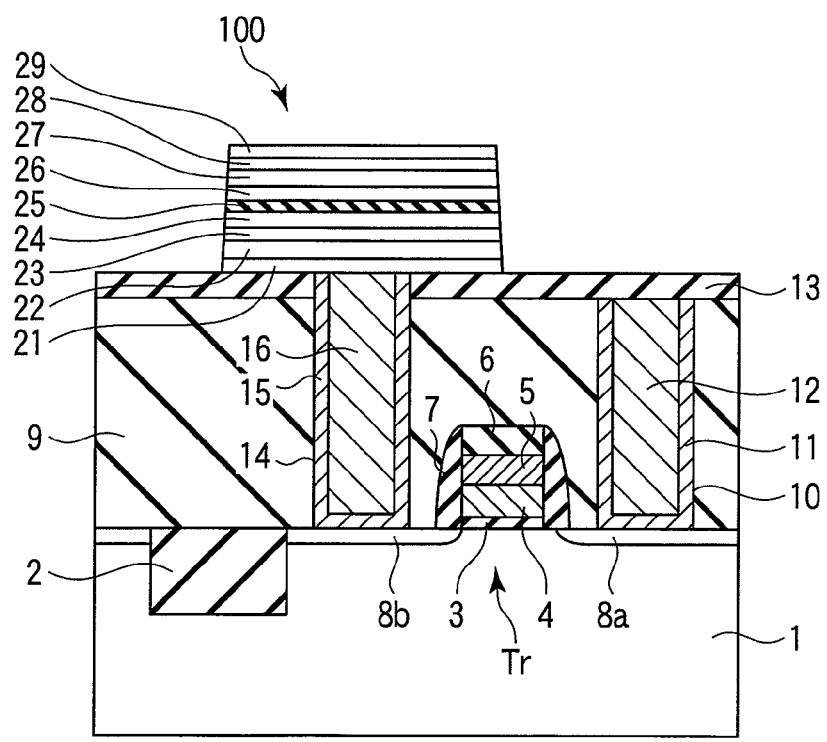
FIG. 5 is a cross-sectional view illustrating a fabrication step, following the step of FIG. 4, of the magnetoresistive random access memory according to the embodiment.

Next, as shown in FIG. 5, a lower electrode 21 of an MTJ element 100 is formed on the contact 16 and CVD nitride film 13. The lower electrode 21 is formed of, e.g. Ta with a thickness of 5 nm. Subsequently, an orientation control film 22 is formed on the lower electrode 21. The orientation control film 22 is formed of, e.g. Pt with a thickness of 5 nm, and has a (001) plane oriented. Then, a pinned layer 23 is formed on the orientation control film 22. The pinned layer 23 is formed of, e.g. $Fe_{50}Pt_{50}$ with a thickness of 10 nm. Subsequently, a first highly oriented magnetic film 24 is formed on the pinned layer 23. The first highly oriented magnetic film 24 is formed of, e.g. $Co_{40}Fe_{40}B_{20}$ with a thickness of 1 nm. Then, a tunneling barrier film 25 is formed on the first highly oriented magnetic film 24. The tunneling barrier film 25 is formed of, e.g. MgO with a thickness of 1.5 nm. Subsequently, a second highly oriented magnetic film 26 is formed on the tunneling barrier film 25. The second highly oriented magnetic film 26 is formed of, e.g. $Co_{40}Fe_{40}B_{20}$ with a thickness of 1 nm. Then, a recording layer 27 is formed on the second highly oriented magnetic film 26. The recording layer 27 is formed of 5-period multilayer films [Co/Pt]5, with one period comprising Co with a film thickness of 0.4 nm and Pt with a film thickness of 0.8 nm. Subsequently, an upper electrode 28 is formed on the recording layer 27. The upper electrode 28 is formed of, e.g. Ta with a thickness of 10 nm. In the above structure, the lower electrode 21, orientation control film 22, pinned layer 23, first highly oriented magnetic film 24, tunneling barrier film 25, second highly oriented magnetic film 26, recording layer 27 and upper electrode 28 are formed by using, for example, a sputtering method.

Next, anneal for crystallizing MgO of the tunneling barrier film 25 is performed, for example, in a vacuum at 360° C. for one hour. By the anneal, the MgO is crystallized, and also the CoFeB films of the first highly oriented magnetic film 24 and second highly oriented magnetic film 26 are crystallized and, furthermore, B is released and the CoFeB films become $Co_{50}Fe_{50}$ films.

Subsequently, a CVD oxide film 29 is deposited as a process mask material on the upper electrode 28. Thereafter, the CVD oxide film 29 is patterned by photolithography and RIE, and a photoresist (not shown), which has been used in this step, is removed. Then, the upper electrode 28, recording layer 27, second highly oriented magnetic film 26, tunneling barrier film 25, first highly oriented magnetic film 24, pinned layer 23, orientation control film 22 and lower electrode 21 are etched by using an RIE method. Thereby, the processing of the MTJ element 100 is completed.

Figure 6:
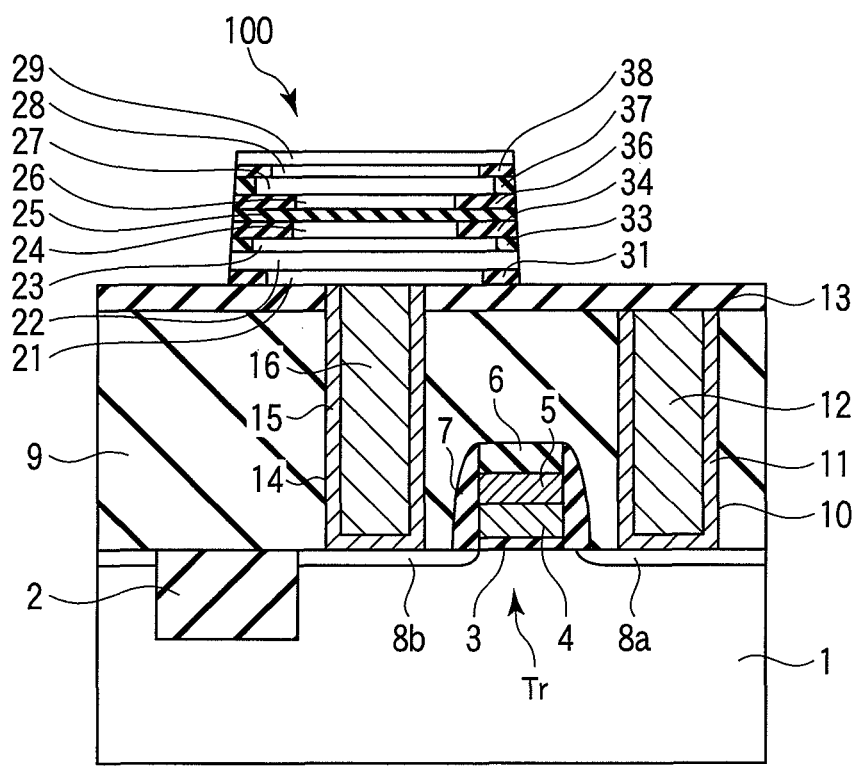
FIG. 6 is a cross-sectional view illustrating a fabrication step, following the step of FIG. 5, of the magnetoresistive random access memory according to the embodiment.

Next, as shown in FIG. 6, the side surfaces of the first highly oriented magnetic film 24 and second highly oriented magnetic film 26 are oxidized in an atmosphere containing oxygen. In an example of the method of the oxidation, the obtained structure is left for 30 minutes at room temperature in $O_2$ of 100 torr, and then annealed for 30 seconds at 300° C. in a vacuum. Thereby, the side surfaces of CoFe of the first highly oriented magnetic film 24 and second highly oriented magnetic film 26 are oxidized, and oxide films 34 and 36, which are rendered nonconductive, are formed. The film thickness (X1, X2) of the oxide film 34, 36 in the horizontal direction with reference to the film surface of the oxide film 34, 36 is, for example, 10 nm. As a result, the area of the tunneling barrier film 25, through which an electric current flows, becomes smaller than the area after the processing. In the present embodiment, since the dimension of the tunneling barrier film 25 is 50 nm on one side, the range of current flow is decreased to 30 nm on one side. Also by performing heat treatment under other conditions, for example, by performing heat treatment for 60 seconds at 300° C. in $O_2$ at 1 Pa, the side surfaces of CoFe with the thickness of 10 nm can be oxidized.

When the side surfaces of the first highly oriented magnetic film 24 and second highly oriented magnetic film 26 are oxidized, the side surfaces of the lower electrode 21, pinned layer 23, recording layer 27 and upper electrode 28 are also oxidized, and oxide films 31, 33, 37 and 38 are formed, respectively.

Next, as shown in FIG. 7, an oxidation-preventing protection film 40 is formed by CVD so as to cover the MTJ element 100. The oxidation-preventing protection film 40 is, for example, a SiN film with a thickness of 5 nm. Then, an interlayer insulation film 41 is formed of an $SiO_2$ film by CVD on the oxidation-preventing protection film 40 and CVD nitride film 13.

Subsequently, a contact 42, which is connected to the upper electrode 29, and a contact 43, which is connected to the contact 12, are formed at the same time. The contacts 42 and 43 are formed such that contact holes are formed, Al is buried in the contact holes, and the resultant structure is planarized by CMP. Then, an oxide film 44 is deposited on the contacts 42 and 43 and interlayer insulation film 41, and trenches are formed in the oxide film 44 by lithography and RIE. The trenches are filled with Al, and the resultant structure is planarized by CMP. Thereby, first wirings 45 and 46, which are connected to the contacts 42 and 43, are formed. Subsequently, an interlayer film 47 is deposited on the first wirings 45 and 46 and oxide film 44, and a via hole is formed in the interlayer film 47 by lithography and RIE. The via hole is filled with Al, and the resultant structure is planarized by CMP. Thereby, a via 48, which is connected to the first wiring 46, is formed. Further, an interlayer film 49 is deposited on the via 48 and interlayer film 47, and a trench for a second wiring is formed by lithography and RIE. This trench is filled with Al, and the resultant structure is planarized by CMP. Thereby, a second wiring 50 for connection to the via 48 is formed. Thereafter, although not shown, upper wiring layers are successively formed, and a magnetoresistive random access memory is completed.

The order of stacking of layers, which constitute the MTJ element 100, may be reversed. In this case, the MTJ element 100 has, for example, the following multilayer structure. A lower electrode 21 of Ta with a thickness of 5 nm is first formed. Then, an orientation control film 22 of Pt with a thickness of 5 nm is formed. The orientation control film 22 has a (001) plane oriented. Then, a recording layer 27 is formed of 5-period multilayer films [Co/Pt]5, with one period comprising Co with a film thickness of 0.4 nm and Pt with a film thickness of 0.8 nm. Subsequently, a first highly oriented magnetic film 24 is formed of $Co_{40}Fe_{40}B_{20}$ with a thickness of 1 nm. Then, a tunneling barrier film 25 of MgO with a thickness of 1.5 nm is formed. Then, a second highly oriented magnetic film 26 is formed of $Co_{40}Fe_{40}B_{20}$ with a thickness of 1 nm. Subsequently, a pinned layer 23 is formed of $Fe_{50}Pt_{50}$ with a thickness of 10 nm. Thereafter, an upper electrode 28 of Ta with a thickness of 10 nm is formed.

[4] Modifications

Figure 9:
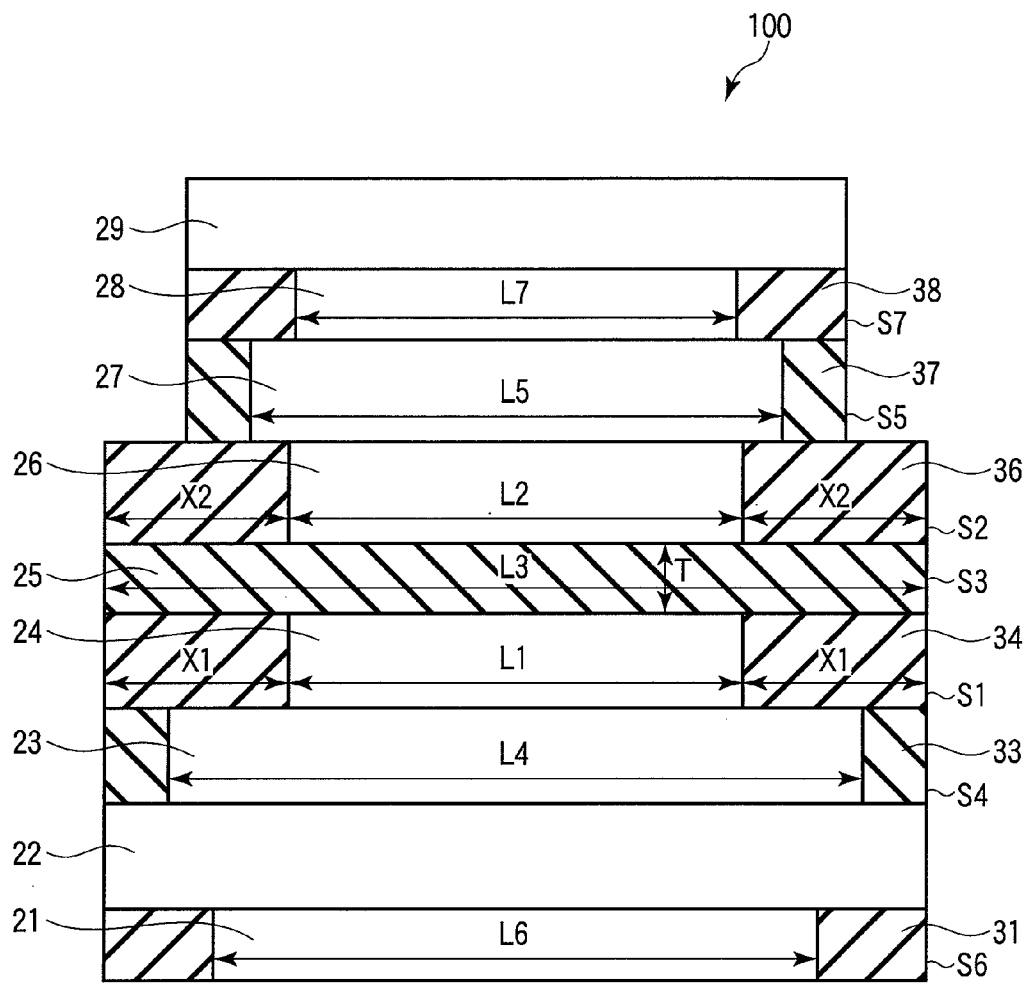
FIG. 9 is a cross-sectional view showing still another MTJ element of the magnetoresistive random access memory according to the embodiment.

FIG. 8 and FIG. 9 show cases in which the multilayer, which constitutes the MTJ element, is not batch-processed, and the MTJ element has a projection shape with stepped portions at side surfaces.

In an MTJ element 100 shown in FIG. 8, the width of a first multilayer portion, which is formed on a tunneling barrier film 25 and comprises a second highly oriented magnetic film 26, a recording layer 27, an upper electrode 28, a CVD oxide film 29 and oxide films 36, 37 and 38, is smaller than the width of a second multilayer portion comprising a lower electrode 21, an orientation control film 22, a pinned layer 23, a first highly oriented magnetic film 24, tunneling barrier film 25 and oxide films 31, 33 and 34. In short, the first multilayer portion of the MTJ element 100 constitutes a projection portion.

In other words, each of a side surface S6 of the oxide film 31, which is opposite to a side surface thereof facing the lower electrode 21; a side surface of the orientation control film 22; a side surface S4 of the oxide film 33, which is opposite to a side surface thereof facing the pinned layer 23; a side surface S1 of the oxide film 34, which is opposite to a side surface thereof facing the first highly oriented magnetic film 24; and a side surface S3 of the tunneling barrier film 25 is configured to project from each of a side surface S2 of the oxide film 36, which is opposite to a side surface thereof facing the second highly oriented magnetic film 26; a side surface S5 of the oxide film 37, which is opposite to a side surface thereof facing the recording layer 27; a side surface S7 of the oxide film 38, which is opposite to a side surface thereof facing the upper electrode 28; and a side of the CVD oxide film 29.

In an MTJ element 100 shown in FIG. 9, the width of a first multilayer portion, which comprises a recording layer 27, an upper electrode 28, a CVD oxide film 29 and oxide films 37 and 38, is smaller than the width of a second multilayer portion comprising a lower electrode 21, an orientation control film 22, a pinned layer 23, a first highly oriented magnetic film 24, tunneling barrier film 25, a second highly oriented magnetic film 26, and oxide films 31, 33, 34 and 36. In short, the first multilayer portion of the MTJ element 100 constitutes a projection portion.

In other words, each of a side surface S6 of the oxide film 31, which is opposite to a side surface thereof facing the lower electrode 21; a side surface of the orientation control film 22; a side surface S4 of the oxide film 33, which is opposite to a side surface thereof facing the pinned layer 23; a side surface S1 of the oxide film 34, which is opposite to a side surface thereof facing the first highly oriented magnetic film 24; a side surface S3 of the tunneling barrier film 25; and a side surface S2 of the oxide film 36, which is opposite to a side surface thereof facing the second highly oriented magnetic film 26 is configured to project from each of a side surface S5 of the oxide film 37, which is opposite to a side surface thereof facing the recording layer 27; a side surface S7 of the oxide film 38, which is opposite to a side surface thereof facing the upper electrode 28; and a side of the CVD oxide film 29.

In the MTJ element 100 with the projection shape shown in FIG. 8, compared to the MTJ element with the vertical shape, since the distance between the upper and lower multilayer portions, between which the tunneling barrier film 25 is sandwiched, can be increased, the leak current at the side walls of the MTJ element 100 can be suppressed. Furthermore, since the oxide films 31, 33, 34, 36, 37 and 38 are present on the side surfaces of the multilayer portions, the effect of suppressing leak current can be enhanced. In the MTJ element 100 with the projection shape shown in FIG. 9, compared to the MTJ element with the vertical shape, a demagnetizing field of the recording layer 27 can be suppressed, and the efficiency of reversion can be increased.

The projection shape of the MTJ element 100 is not limited to the examples shown in FIG. 8 and FIG. 9. It should suffice if a projection portion is formed of one or more of the layers constituting the MTJ element 100. In addition, the MTJ element 100 is not limited to a single junction structure, and may be a double junction structure. Moreover, the multilayer structure of the MTJ element 100 is not limited to the examples of the present embodiment, and may be variously altered.

[5] Advantageous Effects

The effective area of the MTJ element 100 is determined by the area of the metal layer (first highly oriented magnetic film 24, second highly oriented magnetic film 26) at the interface of the insulator (tunnel barrier film 25). Thus, in the present embodiment, the peripheral portions (side wall portions) of both interfaces of the tunnel barrier film 25 are oxidized. Thereby, the oxide films 34 and 36, which are formed of an oxide containing Co and Fe, are formed on the side surfaces of the first highly oriented magnetic film 24 and second highly oriented magnetic film 26, which are formed of, e.g. $Co_{40}Fe_{40}B_{20}$. Since the oxide of Co or Fe is an insulator, an electric field becomes weaker in the insulation film between the peripheral oxides. Accordingly, since an electric current mainly flows in the non-oxidized part of the MTJ element 100, an MTJ element, which is equivalent to the MTJ element 100 that is effectively reduced in size, can be obtained. Thereby, the write current flowing in the transistor Tr can be reduced. Therefore, the film thickness of the source/drain regions 8a and 8b of the transistor Tr can be reduced, the size of the transistor Tr can be reduced, and the magnetoresistive random access memory with a high integration density can be fabricated. Furthermore, by virtue of the presence of the oxide films 31, 33, 34, 36, 37 and 38 at the side surfaces of the MTJ element 100, the problem of sidewall leak can be suppressed.

As has been described above, according to the magnetoresistive random access memory of the above-described embodiment and the manufacturing method thereof, the area of the MTJ element 100 can be reduced by oxidizing the side walls of the MTJ element 100, and thereby the write current can be decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive random access memory comprising:
a magnetoresistive element in a memory cell, the magnetoresistive element including a first metal magnetic layer, a second metal magnetic layer, an insulation layer interposed between the first and second metal magnetic layers, a pinned layer formed on a surface of the first metal magnetic layer, a recording layer formed on a surface of the second metal magnetic layer, a first oxide film formed on a side surface of the first metal magnetic layer, and a second oxide film formed on a side surface of the second metal magnetic layer, a third oxide film formed on a side surface of the pinned layer, and a fourth oxide film formed on a side surface of the recording layer,
wherein the surface of the first metal magnetic layer is opposite to a surface of the first metal magnetic layer facing the insulation layer,
the surface of the second metal magnetic layer is opposite to a surface of the second metal magnetic layer facing the insulation layer,
a side surface of the first oxide film, a side surface of the second oxide film and a side surface of the insulation layer are flush with one another,
the side surface of the first oxide film is opposite to a side surface of the first oxide film facing the first metal magnetic layer,
the side surface of the second oxide film is opposite to a side surface of the second oxide film facing the second metal magnetic layer, and
a side surface of the magnetoresistive element is extended in a direction perpendicular to a substrate,
an area of each of the first and second metal magnetic layers is smaller than an area of the insulation layer, and
an area of each of the pinned layer and the recording layer is smaller than the area of the insulation layer.

2. The memory according to claim 1, wherein a thickness of each of the first and second oxide films in a horizontal direction with reference to a film surface of the first and second oxide films is equal to or greater than a thickness of the insulation layer in a vertical direction with reference to a film surface of the insulation layer.

3. The memory according to claim 1, wherein the area of each of the pinned layer and the recording layer is greater than the area of each of the first and second metal magnetic layers.

4. The memory according to claim 1, wherein the insulation layer is formed of magnesium oxide.

5. The memory according to claim 1, wherein the first and second oxide films contain Co and Fe.

6. A method of manufacturing a magnetoresistive random access memory, comprising:
stacking a first metal magnetic layer, an insulation layer, a second metal magnetic layer, a pinned layer formed on a surface of the first metal magnetic layer, and a recording layer formed on a surface of the second metal magnetic layer included in a magnetoresistive element in a memory cell on a substrate, the surface of the first metal magnetic layer being opposite to a surface of the first metal magnetic layer facing the insulation layer, the surface of the second metal magnetic layer being opposite to a surface of the second metal magnetic layer facing the insulation layer; and
oxidizing a side surface of the first metal magnetic layer, a side surface of the second metal magnetic layer, a side surface of the pinned layer, and a side surface of the recording layer in an atmosphere containing oxygen, forming a first oxide film on the side surface of the first metal magnetic layer, a second oxide film on the side surface of the second metal magnetic layer, a third oxide film on the side surface of the pinned layer, and a fourth oxide film on the side surface of the recording layer included in the magnetoresistive element,
wherein a side surface of the first oxide film, a side surface of the second oxide film and a side surface of the insulation layer are flush with one another,
the side surface of the first oxide film is opposite to a side surface of the first oxide film facing the first metal magnetic layer, the side surface of the second oxide film is opposite to a side surface of the second oxide film facing the second metal magnetic layer, a side surface of the magnetoresistive element is extended in a direction perpendicular to the substrate, an area of each of the first and second metal magnetic layers is smaller than an area of the insulation layer, and an area of each of the pinned layer and the recording layer is smaller than the area of the insulation layer.

7. A magnetoresistive random access memory comprising:

a magnetoresistive element in a memory cell, the magnetoresistive element including a first metal magnetic layer, a second metal magnetic layer, and an insulation layer interposed between the first and second metal magnetic layers, a first oxide film formed on a side surface of the first metal magnetic layer, and a second oxide film formed on a side surface of the second metal magnetic layer, wherein an area of each of the first and second metal magnetic layers is smaller than an area of the insulation layer, a side surface of the first oxide film and a side surface of the insulation layer are configured to project from a side surface of the second oxide film, the side surface of the first oxide film is opposite to a side surface of the first oxide film facing the first metal magnetic layer, the side surface of the second oxide film is opposite to a side surface of the second oxide film facing the second metal magnetic layer, and the magnetoresistive element has a projection shape with a stepped portion on a side surface thereof.

8. A magnetoresistive random access memory comprising:

a magnetoresistive element in a memory cell, the magnetoresistive element including a first metal magnetic layer, a second metal magnetic layer, and an insulation layer interposed between the first and second metal magnetic layers, a pinned layer formed on a surface of the first metal magnetic layer, a recording layer formed on a surface of the second metal magnetic layer, a first oxide film formed on a side surface of the first metal magnetic layer, a second oxide film formed on a side surface of the second metal magnetic layer, a third oxide film formed on a side surface of the pinned layer, and a fourth oxide film formed on a side surface of the recording layer, wherein an area of each of the first and second metal magnetic layers is smaller than an area of the insulation layer, the surface of the first metal magnetic layer is opposite to a surface of the first metal magnetic layer facing the insulation layer, the surface of the second metal magnetic layer is opposite to a surface of the second metal magnetic layer facing the insulation layer, a side surface of the first oxide film, a side surface of the second oxide film, a side surface of the insulation layer and a side surface of the third oxide film are configured to project from a side surface of the fourth oxide film, the side surface of the first oxide film is opposite to a side surface of the first oxide film facing the first metal magnetic layer, the side surface of the second oxide film is opposite to a side surface of the second oxide film facing the second metal magnetic layer, the side surface of the third oxide film is opposite to a side surface of the third oxide film facing the pinned layer, the side surface of the fourth oxide film is opposite to a side surface of the fourth oxide film facing the recording layer, and the magnetoresistive element has a projection shape with a stepped portion on a side surface of the magnetoresistive element.

* * * * *